United States Patent
Lorente et al.

(10) Patent No.: US 9,722,560 B2
(45) Date of Patent: Aug. 1, 2017

(54) FILTER WITH INDEPENDENTLY ADJUSTABLE BAND GAIN AND BREAK POINT SLOPES AND METHOD OF CONSTRUCTING SAME

(71) Applicant: Meyer Sound Laboratories, Incorporated, Berkeley, CA (US)

(72) Inventors: David Lorente, San Antonio de Benageber (ES); Todd Meier, Walnut Creek, CA (US); Perrin Meyer, Albany, CA (US); Luke Jenks, San Anselmo, CA (US)

(73) Assignee: Meyer Sound Laboratories, Incorporated, Berkeley, CA (US)

( * ) Notice: Subject to any disclaimer, the term of this patent is extended or adjusted under 35 U.S.C. 154(b) by 316 days.

(21) Appl. No.: 14/292,874

(22) Filed: May 31, 2014

(65) Prior Publication Data

US 2015/0036841 A1    Feb. 5, 2015

Related U.S. Application Data

(60) Provisional application No. 61/829,988, filed on May 31, 2013.

(51) Int. Cl.
*H03G 5/00* (2006.01)
*H03G 5/16* (2006.01)
(Continued)

(52) U.S. Cl.
CPC ............... *H03G 5/165* (2013.01); *H04R 3/04* (2013.01); *H04S 7/307* (2013.01)

(58) Field of Classification Search
CPC .......... H03G 5/165; H03G 5/025; H03G 5/02; H03G 5/16; H04R 1/20; H04R 1/22; H04R 3/04
(Continued)

(56) References Cited

U.S. PATENT DOCUMENTS

| | | |
|---|---|---|
| 5,046,105 A | 9/1991 | Bohn |
| 5,506,910 A | 4/1996 | Miller et al. |

(Continued)

FOREIGN PATENT DOCUMENTS

WO       2009155057      12/2009
WO PCT/US2014/040424    5/2014

*Primary Examiner* — Md S Elahee
*Assistant Examiner* — Sabrina Diaz
(74) *Attorney, Agent, or Firm* — Beeson Skinner Beverly, LLP

(57) ABSTRACT

A filter for equalizing the frequency response of loudspeaker systems includes at least one band filter section (11) comprised an n-order high boost or cut shelving fitter (13) having a break point frequency, $\omega_1$, and an n-order low boost or cut shelving filter (15) having a break point frequency, $\omega_2$, wherein $\omega_1 < \omega_2$. The order, n, of at least one, and preferably both of the shelving filters of the band filter sections can be selected for adjusting the slope of the shelving filter at one or both of its break point frequencies. The high and low n-order shelving filters forming the band filter sections have substantially the same gain and produce a resultant band gain for the band filter section. Gain correction is provided for the selectable n-order high shelving filter and n-order low shelving filter for correcting the resultant band gain to a base gain level.

13 Claims, 19 Drawing Sheets

(51) Int. Cl.
*H04R 3/04* (2006.01)
*H04S 7/00* (2006.01)

(58) Field of Classification Search
USPC .................................................. 381/98, 103
See application file for complete search history.

(56) References Cited

U.S. PATENT DOCUMENTS

| | | |
|---|---|---|
| 7,043,032 B1 | 5/2006 | Jeffs et al. |
| 8,001,170 B2 | 8/2011 | Hsu |
| 2011/0096933 A1* | 4/2011 | Eastty ...................... H03G 3/00 381/56 |

* cited by examiner

Table 1: Break point 1 analog prototype coefficients for boost case (normalized frquency).

| $Slope_1$ | $A_1$ | $B_1$ | $C_1$ | $D_1$ | $E_1$ | $F_1$ | $G_1$ | $H_1$ | $I_1$ | $J_1$ | $K_1$ | $L_1$ |
|---|---|---|---|---|---|---|---|---|---|---|---|---|
| 1 | 0 | $\frac{G_2}{G_1}$ | 1 | 0 | 1 | 1 | 0 | 0 | 1 | 0 | 0 | 1 |
| 2 | $\frac{G_2}{G_1}$ | $\sqrt{2 \cdot \frac{G_2}{G_1}}$ | 1 | 1 | $\sqrt{2}$ | 1 | 0 | 0 | 1 | 0 | 0 | 1 |
| 3 | 0 | $\sqrt[3]{\frac{G_2}{G_1}}$ | 1 | 0 | 1 | 1 | $\sqrt[3]{\left(\frac{G_2}{G_1}\right)^2}$ | $\sqrt[3]{\frac{G_2}{G_1}}$ | 1 | 1 | 1 | 1 |
| 4 | $\sqrt{\frac{G_2}{G_1}}$ | $2\cos\left(\frac{\pi}{8}\right)\sqrt[4]{\frac{G_2}{G_1}}$ | 1 | 1 | $2\cos\left(\frac{\pi}{8}\right)$ | 1 | $\sqrt{\frac{G_2}{G_1}}$ | $2\cos\left(\frac{3\pi}{8}\right)\sqrt[4]{\frac{G_2}{G_1}}$ | 1 | 1 | $2\cos\left(\frac{3\pi}{8}\right)$ | 1 |
| 5 | $\sqrt[5]{\left(\frac{G_2}{G_1}\right)^2}$ | $2\cos\left(\frac{\pi}{5}\right)\sqrt[5]{\frac{G_2}{G_1}}$ | 1 | 1 | $2\cos\left(\frac{\pi}{5}\right)$ | 1 | $\left(\frac{G_2}{G_1}\right)^2\sqrt[5]{\frac{G_2}{G_1}}$ | $2\cos\left(\frac{2\pi}{5}\right)\sqrt[5]{\frac{G_2}{G_1}}$ | 1 | 1 | $2\cos\left(\frac{2\pi}{5}\right)$ | 1 |
| 6 | $\sqrt[5]{\frac{G_2}{G_1}}$ | $2\cos\left(\frac{\pi}{12}\right)\sqrt[6]{\frac{G_2}{G_1}}$ | 1 | 1 | $2\cos\left(\frac{\pi}{12}\right)$ | 1 | $\sqrt[3]{\frac{G_2}{G_1}}$ | $2\cos\left(\frac{3\pi}{12}\right)\sqrt[6]{\frac{G_2}{G_1}}$ | 1 | 1 | $2\cos\left(\frac{3\pi}{12}\right)$ | 1 |
| 7 | $\sqrt[7]{\left(\frac{G_2}{G_1}\right)^2}$ | $2\cos\left(\frac{3\pi}{7}\right)\sqrt[7]{\frac{G_2}{G_1}}$ | 1 | 1 | $2\cos\left(\frac{3\pi}{7}\right)$ | 1 | $\sqrt[7]{\left(\frac{G_2}{G_1}\right)^2}$ | $2\cos\left(\frac{2\pi}{7}\right)\sqrt[7]{\frac{G_2}{G_1}}$ | 1 | 1 | $2\cos\left(\frac{2\pi}{7}\right)$ | 1 |
| 8 | $\sqrt[4]{\frac{G_2}{G_1}}$ | $2\cos\left(\frac{7\pi}{16}\right)\sqrt[8]{\frac{G_2}{G_1}}$ | 1 | 1 | $2\cos\left(\frac{7\pi}{16}\right)$ | 1 | $\sqrt[4]{\frac{G_2}{G_1}}$ | $2\cos\left(\frac{5\pi}{16}\right)\sqrt[8]{\frac{G_2}{G_1}}$ | 1 | 1 | $2\cos\left(\frac{5\pi}{16}\right)$ | 1 |

*FIG. 10A-1*

Table 1: Break point 1 analog prototype coefficients for boost case (normalized frequency).

| $Slope_1$ | $M_1$ | $N_1$ | $O_1$ | $P_1$ | $Q_1$ | $R_1$ | $S_1$ | $T_1$ | $U_1$ | $V_1$ | $W_1$ | $X_1$ |
|---|---|---|---|---|---|---|---|---|---|---|---|---|
| 1 | 0 | 0 | 1 | 0 | 0 | 1 | 0 | 0 | 1 | 0 | 0 | 1 |
| 2 | 0 | 0 | 1 | 0 | 0 | 1 | 0 | 0 | 1 | 0 | 0 | 1 |
| 3 | 0 | 0 | 1 | 0 | 0 | 1 | 0 | 0 | 1 | 0 | 0 | 1 |
| 4 | 0 | 0 | 1 | 0 | 0 | 1 | 0 | 0 | 1 | 0 | 0 | 1 |
| 5 | 0 | $\sqrt[5]{\frac{G_2}{G_1}}$ | 1 | 0 | 1 | 1 | 0 | 0 | 1 | 0 | 0 | 1 |
| 6 | $\sqrt[3]{\frac{G_2}{G_1}}$ | $2\cos\left(\frac{5\pi}{12}\right)\sqrt[6]{\frac{G_2}{G_1}}$ | 1 | 1 | $2\cos\left(\frac{5\pi}{12}\right)$ | 1 | 0 | 0 | 1 | 0 | 0 | 1 |
| 7 | $\sqrt[7]{\left(\frac{G_2}{G_1}\right)^2}$ | $2\cos\left(\frac{\pi}{7}\right)\sqrt[7]{\frac{G_2}{G_1}}$ | 1 | 1 | $2\cos\left(\frac{\pi}{7}\right)$ | 1 | 0 | $\sqrt[7]{\frac{G_2}{G_1}}$ | 1 | 0 | 1 | 1 |
| 8 | $\sqrt[4]{\frac{G_2}{G_1}}$ | $2\cos\left(\frac{3\pi}{16}\right)\sqrt[8]{\frac{G_2}{G_1}}$ | 1 | 1 | $2\cos\left(\frac{3\pi}{16}\right)$ | 1 | $\sqrt[4]{\frac{G_2}{G_1}}$ | $2\cos\left(\frac{\pi}{16}\right)\sqrt[8]{\frac{G_2}{G_1}}$ | 1 | 1 | $2\cos\left(\frac{\pi}{16}\right)$ | 1 |

FIG. 10A-2

Table 2: Break point 1 analog prototype coefficients for cutt case (normalized frquency).

| $Slope_1$ | $A_1$ | $B_1$ | $C_1$ | $D_1$ | $E_1$ | $F_1$ | $G_1$ | $H_1$ | $I_1$ | $J_1$ | $K_1$ | $L_1$ |
|---|---|---|---|---|---|---|---|---|---|---|---|---|
| 1 | 0 | 1 | 1 | 0 | $\frac{G_1}{G_2}$ | 1 | 0 | 0 | 1 | 0 | 0 | 1 |
| 2 | 1 | $\sqrt{2}$ | 1 | $\frac{G_1}{G_2}$ | $2 \cdot \frac{G_1}{G_2}$ | 1 | 0 | 0 | 1 | 0 | 0 | 1 |
| 3 | 0 | 1 | 1 | 0 | $\sqrt[3]{\frac{G_1}{G_2}}$ | 1 | 1 | 1 | 1 | 0 | $\sqrt[3]{\frac{G_1}{G_2}}$ | 1 |
| 4 | 1 | $2\cos\left(\frac{\pi}{8}\right)$ | 1 | $\sqrt[5]{\frac{G_1}{G_2}}$ | $2\cos\left(\frac{\pi}{8}\right)\sqrt[4]{\frac{G_1}{G_2}}$ | 1 | 1 | $2\cos\left(\frac{3\pi}{8}\right)$ | 1 | $\left(\sqrt[5]{\frac{G_1}{G_2}}\right)^2$ | $2\cos\left(\frac{3\pi}{8}\right)\sqrt[4]{\frac{G_1}{G_2}}$ | 1 |
| 5 | 1 | $2\cos\left(\frac{\pi}{5}\right)$ | 1 | $\left(\sqrt[3]{\frac{G_1}{G_2}}\right)^2$ | $2\cos\left(\frac{\pi}{5}\right)\sqrt[5]{\frac{G_1}{G_2}}$ | 1 | 1 | $2\cos\left(\frac{2\pi}{5}\right)$ | 1 | $\sqrt[5]{\frac{G_1}{G_2}}$ | $2\cos\left(\frac{2\pi}{5}\right)\sqrt[5]{\frac{G_1}{G_2}}$ | 1 |
| 6 | 1 | $2\cos\left(\frac{\pi}{12}\right)$ | 1 | $\sqrt[3]{\frac{G_1}{G_2}}$ | $2\cos\left(\frac{\pi}{12}\right)\sqrt[6]{\frac{G_1}{G_2}}$ | 1 | 1 | $2\cos\left(\frac{3\pi}{12}\right)$ | 1 | $\sqrt[3]{\frac{G_1}{G_2}}$ | $2\cos\left(\frac{3\pi}{12}\right)\sqrt[6]{\frac{G_1}{G_2}}$ | 1 |
| 7 | 1 | $2\cos\left(\frac{3\pi}{7}\right)$ | 1 | $\left(\sqrt[7]{\frac{G_1}{G_2}}\right)^2$ | $2\cos\left(\frac{3\pi}{7}\right)\sqrt[7]{\frac{G_1}{G_2}}$ | 1 | 1 | $2\cos\left(\frac{2\pi}{7}\right)$ | 1 | $\left(\sqrt[7]{\frac{G_1}{G_2}}\right)^2$ | $2\cos\left(\frac{2\pi}{7}\right)\sqrt[7]{\frac{G_1}{G_2}}$ | 1 |
| 8 | 1 | $2\cos\left(\frac{7\pi}{16}\right)$ | 1 | $\sqrt[7]{\frac{G_1}{G_2}}$ | $2\cos\left(\frac{7\pi}{16}\right)\sqrt[8]{\frac{G_1}{G_2}}$ | 1 | 1 | $2\cos\left(\frac{5\pi}{16}\right)$ | 1 | $\sqrt[4]{\frac{G_1}{G_2}}$ | $2\cos\left(\frac{5\pi}{16}\right)\sqrt[8]{\frac{G_1}{G_2}}$ | 1 |

*FIG. 10B-1*

Table 2: Break point 1 analog prototype coefficients for cutt case (normalized frquency).

| $Slope_1$ | $M_1$ | $N_1$ | $O_1$ | $P_1$ | $Q_1$ | $R_1$ | $S_1$ | $T_1$ | $U_1$ | $V_1$ | $W_1$ | $X_1$ |
|---|---|---|---|---|---|---|---|---|---|---|---|---|
| 1 | 0 | 0 | 1 | 0 | 0 | 1 | 0 | 0 | 1 | 0 | 0 | 1 |
| 2 | 0 | 0 | 1 | 0 | 0 | 1 | 0 | 0 | 1 | 0 | 0 | 1 |
| 3 | 0 | 0 | 1 | 0 | 0 | 1 | 0 | 0 | 1 | 0 | 0 | 1 |
| 4 | 0 | 0 | 1 | 0 | 0 | 1 | 0 | 0 | 1 | 0 | 0 | 1 |
| 5 | 0 | 1 | 1 | 0 | $\sqrt[5]{\frac{G_1}{G_2}}$ | 1 | 0 | 0 | 1 | 0 | 0 | 1 |
| 6 | 1 | $2\cos\left(\frac{5\pi}{12}\right)$ | 1 | $\sqrt[3]{\frac{G_1}{G_2}}$ | $2\cos\left(\frac{5\pi}{12}\right)\sqrt[6]{\frac{G_1}{G_2}}$ | 1 | 0 | 0 | 1 | 0 | 0 | 1 |
| 7 | 1 | $2\cos\left(\frac{\pi}{7}\right)$ | 1 | $\sqrt[7]{\left(\frac{G_1}{G_2}\right)^2}$ | $2\cos\left(\frac{\pi}{7}\right)\sqrt[7]{\frac{G_1}{G_2}}$ | 1 | 1 | 1 | 1 | 0 | 0 | 1 |
| 8 | 1 | $2\cos\left(\frac{3\pi}{16}\right)$ | 1 | $\sqrt[4]{\frac{G_1}{G_2}}$ | $2\cos\left(\frac{3\pi}{16}\right)\sqrt[8]{\frac{G_1}{G_2}}$ | 1 | 1 | $2\cos\left(\frac{\pi}{16}\right)$ | 1 | $\sqrt[4]{\frac{G_1}{G_2}}$ | $2\cos\left(\frac{\pi}{16}\right)\sqrt[8]{\frac{G_1}{G_2}}$ | 1 |

FIG. 10B-2

Table 3: Break point 2 analog prototype coefficients for boost case (normalized frequency).

| $Slope_2$ | $A_2$ | $B_2$ | $C_2$ | $D_2$ | $E_2$ | $F_2$ | $G_2$ | $H_2$ | $I_2$ | $J_2$ | $K_2$ | $L_2$ |
|---|---|---|---|---|---|---|---|---|---|---|---|---|
| 1 | 0 | 1 | $\frac{G_2}{G_3}$ | 0 | 1 | 1 | 0 | 0 | 1 | 0 | 0 | 1 |
| 2 | 1 | $\sqrt[4]{2 \cdot \frac{G_2}{G_3}}$ | 1 | 1 | $\sqrt{2}$ | 1 | 0 | 0 | 1 | 0 | 0 | 1 |
| 3 | 0 | 1 | $\sqrt[3]{\frac{G_2}{G_3}}$ | 0 | 1 | 1 | 1 | $\sqrt[3]{\frac{G_2}{G_3}}$ | $\sqrt[3]{\left(\frac{G_2}{G_3}\right)^2}$ | 1 | 1 | 1 |
| 4 | 1 | $2\cos\left(\frac{\pi}{8}\right)\sqrt[4]{\frac{G_2}{G_3}}$ | $\sqrt[3]{\frac{G_2}{G_3}}$ | 1 | $2\cos\left(\frac{\pi}{8}\right)$ | 1 | 1 | $2\cos\left(\frac{3\pi}{8}\right)\sqrt[4]{\frac{G_2}{G_3}}$ | $\sqrt[3]{\left(\frac{G_2}{G_3}\right)^2}$ | 1 | $2\cos\left(\frac{3\pi}{8}\right)$ | 1 |
| 5 | 1 | $2\cos\left(\frac{\pi}{5}\right)\sqrt[5]{\frac{G_2}{G_3}}$ | $\sqrt[5]{\left(\frac{G_2}{G_3}\right)^2}$ | 1 | $2\cos\left(\frac{\pi}{5}\right)$ | 1 | 1 | $2\cos\left(\frac{2\pi}{5}\right)\sqrt[5]{\frac{G_2}{G_3}}$ | $\sqrt[5]{\left(\frac{G_2}{G_3}\right)^2}$ | 1 | $2\cos\left(\frac{2\pi}{5}\right)$ | 1 |
| 6 | 1 | $2\cos\left(\frac{\pi}{12}\right)\sqrt[6]{\frac{G_2}{G_3}}$ | $\sqrt[3]{\frac{G_2}{G_3}}$ | 1 | $2\cos\left(\frac{\pi}{12}\right)$ | 1 | 1 | $2\cos\left(\frac{3\pi}{12}\right)\sqrt[6]{\frac{G_2}{G_3}}$ | $\sqrt[3]{\frac{G_2}{G_3}}$ | 1 | $2\cos\left(\frac{3\pi}{12}\right)$ | 1 |
| 7 | 1 | $2\cos\left(\frac{3\pi}{7}\right)\sqrt[7]{\frac{G_2}{G_3}}$ | $\sqrt[7]{\left(\frac{G_2}{G_3}\right)^2}$ | 1 | $2\cos\left(\frac{3\pi}{7}\right)$ | 1 | 1 | $2\cos\left(\frac{2\pi}{7}\right)\sqrt[7]{\frac{G_2}{G_3}}$ | $\sqrt[7]{\left(\frac{G_2}{G_3}\right)^2}$ | 1 | $2\cos\left(\frac{2\pi}{7}\right)$ | 1 |
| 8 | 1 | $2\cos\left(\frac{7\pi}{16}\right)\sqrt[8]{\frac{G_2}{G_3}}$ | $\sqrt[4]{\frac{G_2}{G_3}}$ | 1 | $2\cos\left(\frac{7\pi}{16}\right)$ | 1 | 1 | $2\cos\left(\frac{5\pi}{16}\right)\sqrt[8]{\frac{G_2}{G_3}}$ | $\sqrt[4]{\frac{G_2}{G_3}}$ | 1 | $2\cos\left(\frac{5\pi}{16}\right)$ | 1 |

*FIG. 10C-1*

Table 3: Break point 2 analog prototype coefficients for boost case (normalized frequency).

| $Slope_2$ | $M_2$ | $N_2$ | $O_2$ | $P_2$ | $Q_2$ | $R_2$ | $S_2$ | $T_2$ | $U_2$ | $V_2$ | $W_2$ | $X_2$ |
|---|---|---|---|---|---|---|---|---|---|---|---|---|
| 1 | 0 | 0 | 1 | 0 | 0 | 1 | 0 | 0 | 1 | 0 | 0 | 1 |
| 2 | 0 | 0 | 1 | 0 | 0 | 1 | 0 | 0 | 1 | 0 | 0 | 1 |
| 3 | 0 | 0 | 1 | 0 | 0 | 1 | 0 | 0 | 1 | 0 | 0 | 1 |
| 4 | 0 | 0 | 1 | 0 | 0 | 1 | 0 | 0 | 1 | 0 | 0 | 1 |
| 5 | 0 | 1 | $\sqrt[5]{\frac{G_2}{G_3}}$ | 0 | 1 | 1 | 0 | 0 | 1 | 0 | 0 | 1 |
| 6 | 1 | $2\cos\left(\frac{5\pi}{12}\right)\sqrt[6]{\frac{G_2}{G_3}}$ | $\sqrt[3]{\frac{G_2}{G_3}}$ | 1 | $2\cos\left(\frac{5\pi}{12}\right)$ | 1 | 0 | 0 | 1 | 0 | 0 | 1 |
| 7 | 1 | $2\cos\left(\frac{\pi}{7}\right)\sqrt[7]{\frac{G_2}{G_3}}$ | $\sqrt[7]{\left(\frac{G_2}{G_3}\right)^2}$ | 1 | $2\cos\left(\frac{\pi}{7}\right)$ | 1 | 0 | 1 | $\sqrt[7]{\frac{G_2}{G_3}}$ | 0 | 1 | 1 |
| 8 | 1 | $2\cos\left(\frac{3\pi}{16}\right)\sqrt[8]{\frac{G_2}{G_3}}$ | $\sqrt[4]{\frac{G_2}{G_3}}$ | 1 | $2\cos\left(\frac{3\pi}{16}\right)$ | 1 | 0 | $2\cos\left(\frac{\pi}{16}\right)\sqrt[8]{\frac{G_2}{G_3}}$ | $\sqrt[4]{\frac{G_2}{G_3}}$ | 1 | $2\cos\left(\frac{\pi}{16}\right)$ | 1 |

*FIG. 10C-2*

Table 4: Break point 2 analog prototype coefficients for cut case (normalized frquency).

| $Slope_2$ | $A_2$ | $B_2$ | $C_2$ | $D_2$ | $E_2$ | $F_2$ | $G_2$ | $H_2$ | $I_2$ | $J_2$ | $K_2$ | $L_2$ |
|---|---|---|---|---|---|---|---|---|---|---|---|---|
| 1 | 0 | 1 | 1 | 0 | 1 | $\dfrac{G_3}{G_2}$ | 0 | 0 | 1 | 0 | 0 | 1 |
| 2 | 1 | 1 | 1 | 1 | $\sqrt{2 \cdot \dfrac{G_3}{G_2}}$ | $\dfrac{G_3}{G_2}$ | 0 | 0 | 1 | 0 | 0 | 1 |
| 3 | 0 | $\sqrt{2}$ | 1 | 0 | 1 | $\sqrt[3]{\dfrac{G_3}{G_2}}$ | 1 | 1 | 1 | 1 | $\sqrt[3]{\dfrac{G_3}{G_2}}$ | $\sqrt[3]{\left(\dfrac{G_3}{G_2}\right)^2}$ |
| 4 | 1 | $2\cos\left(\dfrac{\pi}{8}\right)$ | 1 | 1 | $2\cos\left(\dfrac{\pi}{8}\right)\sqrt[4]{\dfrac{G_3}{G_2}}$ | $\sqrt[3]{\dfrac{G_3}{G_2}}$ | 1 | $2\cos\left(\dfrac{3\pi}{8}\right)$ | 1 | 1 | $2\cos\left(\dfrac{3\pi}{8}\right)\sqrt[4]{\dfrac{G_3}{G_2}}$ | $\sqrt[3]{\left(\dfrac{G_3}{G_2}\right)^2}$ |
| 5 | 1 | $2\cos\left(\dfrac{\pi}{5}\right)$ | 1 | 1 | $2\cos\left(\dfrac{\pi}{5}\right)\sqrt[5]{\dfrac{G_3}{G_2}}$ | $\sqrt[5]{\left(\dfrac{G_3}{G_2}\right)^2}$ | 1 | $2\cos\left(\dfrac{2\pi}{5}\right)$ | 1 | 1 | $2\cos\left(\dfrac{2\pi}{5}\right)\sqrt[5]{\dfrac{G_3}{G_2}}$ | $\sqrt[5]{\left(\dfrac{G_3}{G_2}\right)^2}$ |
| 6 | 1 | $2\cos\left(\dfrac{\pi}{12}\right)$ | 1 | 1 | $2\cos\left(\dfrac{\pi}{12}\right)\sqrt[6]{\dfrac{G_3}{G_2}}$ | $\sqrt[3]{\dfrac{G_3}{G_2}}$ | 1 | $2\cos\left(\dfrac{3\pi}{12}\right)$ | 1 | 1 | $2\cos\left(\dfrac{3\pi}{12}\right)\sqrt[6]{\dfrac{G_3}{G_2}}$ | $\sqrt[3]{\dfrac{G_3}{G_2}}$ |
| 7 | 1 | $2\cos\left(\dfrac{3\pi}{7}\right)$ | 1 | 1 | $2\cos\left(\dfrac{3\pi}{7}\right)\sqrt[7]{\dfrac{G_3}{G_2}}$ | $\sqrt[7]{\left(\dfrac{G_3}{G_2}\right)^2}$ | 1 | $2\cos\left(\dfrac{2\pi}{7}\right)$ | 1 | 1 | $2\cos\left(\dfrac{2\pi}{7}\right)\sqrt[7]{\dfrac{G_3}{G_2}}$ | $\sqrt[7]{\dfrac{G_3}{G_2}}$ |
| 8 | 1 | $2\cos\left(\dfrac{7\pi}{16}\right)$ | 1 | 1 | $2\cos\left(\dfrac{7\pi}{16}\right)\sqrt[8]{\dfrac{G_3}{G_2}}$ | $\sqrt[4]{\dfrac{G_3}{G_2}}$ | 1 | $2\cos\left(\dfrac{5\pi}{16}\right)$ | 1 | 1 | $2\cos\left(\dfrac{5\pi}{16}\right)\sqrt[8]{\dfrac{G_3}{G_2}}$ | $\sqrt[4]{\dfrac{G_3}{G_2}}$ |

FIG. 10D-1

Table 4: Break point 2 analog prototype coefficients for cut case (normalized frequency).

| $Slope_2$ | $M_2$ | $N_2$ | $O_2$ | $P_2$ | $Q_2$ | $R_2$ | $S_2$ | $T_2$ | $U_2$ | $V_2$ | $W_2$ | $X_2$ |
|---|---|---|---|---|---|---|---|---|---|---|---|---|
| 1 | 0 | 0 | 1 | 0 | 0 | 1 | 0 | 0 | 1 | 0 | 0 | 1 |
| 2 | 0 | 0 | 1 | 0 | 0 | 1 | 0 | 0 | 1 | 0 | 0 | 1 |
| 3 | 0 | 0 | 1 | 0 | 0 | 1 | 0 | 0 | 1 | 0 | 0 | 1 |
| 4 | 0 | 0 | 1 | 0 | 0 | 1 | 0 | 0 | 1 | 0 | 0 | 1 |
| 5 | 0 | 1 | 1 | 0 | 1 | $\sqrt[5]{G_3/G_2}$ | 0 | 0 | 1 | 0 | 0 | 1 |
| 6 | 1 | $2\cos\left(\frac{5\pi}{12}\right)$ | 1 | 1 | $2\cos\left(\frac{5\pi}{12}\right)\sqrt[6]{G_3/G_2}$ | $\sqrt[3]{G_3/G_2}$ | 0 | 0 | 1 | 0 | 0 | 1 |
| 7 | 1 | $2\cos\left(\frac{\pi}{7}\right)$ | 1 | 1 | $2\cos\left(\frac{\pi}{7}\right)\sqrt[7]{G_3/G_2}$ | $\sqrt[7]{(G_3/G_2)^2}$ | 1 | 1 | 1 | 0 | 1 | $\sqrt[7]{G_3/G_2}$ |
| 8 | 1 | $2\cos\left(\frac{3\pi}{16}\right)$ | 1 | 1 | $2\cos\left(\frac{3\pi}{16}\right)\sqrt[8]{G_3/G_2}$ | $\sqrt[4]{G_3/G_2}$ | 1 | $2\cos\left(\frac{\pi}{16}\right)$ | 1 | 1 | $2\cos\left(\frac{\pi}{16}\right)\sqrt[8]{G_1/G_2}$ | $\sqrt[4]{G_3/G_2}$ |

FIG. 10D-2

FIG. 10E    Table 5: Break point 3 analog prototype coefficients for boost case (normalized frquency).

| $Slope_3$ | $A_3$ | $B_3$ | $C_3$ | $D_3$ | $E_3$ | $F_3$ | $G_3$ | $H_3$ | $I_3$ | $J_3$ | $K_3$ | $L_3$ |
|---|---|---|---|---|---|---|---|---|---|---|---|---|
| 1 | 0 | $\frac{G_4}{G_3}$ | 1 | 0 | 1 | 1 | 0 | 0 | 1 | 0 | 0 | 1 |
| 2 | $\frac{G_4}{G_3}$ | $2 \cdot \sqrt[4]{\frac{G_4}{G_3}}$ | 1 | 1 | $\sqrt{2}$ | 1 | 0 | 0 | 1 | 0 | 0 | 1 |
| 3 | 0 | $\sqrt[3]{\frac{G_4}{G_3}}$ | 1 | 0 | 1 | 1 | $\sqrt[3]{\left(\frac{G_4}{G_3}\right)^2}$ | $\sqrt[3]{\frac{G_4}{G_3}}$ | 1 | 1 | 1 | 1 |
| 4 | $\sqrt{\frac{G_4}{G_3}}$ | $2\cos\left(\frac{\pi}{8}\right)\sqrt[4]{\frac{G_4}{G_3}}$ | 1 | 1 | $2\cos\left(\frac{\pi}{8}\right)$ | 1 | $\sqrt{\frac{G_4}{G_3}}$ | $2\cos\left(\frac{3\pi}{8}\right)\sqrt[4]{\frac{G_4}{G_3}}$ | 1 | 1 | $2\cos\left(\frac{3\pi}{8}\right)$ | 1 |

FIG. 10F    Table 6: Break point 3 analog prototype coefficients for cut case (normalized frquency).

| $Slope_3$ | $A_3$ | $B_3$ | $C_3$ | $D_3$ | $E_3$ | $F_3$ | $G_3$ | $H_3$ | $I_3$ | $J_3$ | $K_3$ | $L_3$ |
|---|---|---|---|---|---|---|---|---|---|---|---|---|
| 1 | 0 | 1 | 1 | 0 | $\frac{G_3}{G_4}$ | 1 | 0 | 0 | 1 | 0 | 0 | 1 |
| 2 | 1 | $\sqrt{2}$ | 1 | $\frac{G_3}{G_4}$ | $2 \cdot \sqrt{\frac{G_3}{G_4}}$ | 1 | 0 | 0 | 1 | 0 | 0 | 1 |
| 3 | 0 | 1 | 1 | 0 | $\sqrt[3]{\frac{G_3}{G_4}}$ | 1 | 0 | 1 | 1 | 0 | $\sqrt[3]{\frac{G_3}{G_4}}$ | 1 |
| 4 | 1 | $2\cos\left(\frac{\pi}{8}\right)$ | 1 | $\sqrt{\frac{G_3}{G_4}}$ | $2\cos\left(\frac{\pi}{8}\right)\sqrt[4]{\frac{G_3}{G_4}}$ | 1 | 1 | $2\cos\left(\frac{3\pi}{8}\right)$ | 1 | $\sqrt{\frac{G_3}{G_4}}$ | $2\cos\left(\frac{3\pi}{8}\right)\sqrt[4]{\frac{G_3}{G_4}}$ | 1 |

FIG. 10G  Table 7: Break point 4 analog prototype coefficients for boost case (normalized frequency).

| $Slope_4$ | $A_4$ | $B_4$ | $C_4$ | $D_4$ | $E_4$ | $F_4$ | $G_4$ | $H_4$ | $I_4$ | $J_4$ | $K_4$ | $L_4$ |
|---|---|---|---|---|---|---|---|---|---|---|---|---|
| 1 | 0 | 1 | $\frac{G_4}{G_5}$ | 0 | 1 | 1 | 0 | 0 | 1 | 0 | 0 | 1 |
| 2 | 1 | $\sqrt[4]{2 \cdot \frac{G_4}{G_5}}$ | 1 | 1 | $\sqrt{2}$ | 1 | 0 | 0 | 1 | 0 | 0 | 1 |
| 3 | 0 | 1 | $\sqrt[3]{\frac{G_4}{G_5}}$ | 0 | 1 | 1 | 1 | $\sqrt[3]{\frac{G_4}{G_5}}$ | $\sqrt{\left(\frac{G_4}{G_5}\right)^2}$ | 1 | 1 | 1 |
| 4 | 1 | $2\cos\left(\frac{\pi}{8}\right)\sqrt[4]{\frac{G_4}{G_5}}$ | $\sqrt{\frac{G_4}{G_5}}$ | 1 | $2\cos\left(\frac{\pi}{8}\right)$ | 1 | 1 | $2\cos\left(\frac{3\pi}{8}\right)\sqrt[4]{\frac{G_4}{G_5}}$ | $\sqrt{\frac{G_4}{G_5}}$ | 1 | $2\cos\left(\frac{3\pi}{8}\right)$ | 1 |

FIG. 10H  Table 8: Break point 4 analog prototype coefficients for cut case (normalized frequency).

| $Slope_4$ | $A_4$ | $B_4$ | $C_4$ | $D_4$ | $E_4$ | $F_4$ | $G_4$ | $H_4$ | $I_4$ | $J_4$ | $K_4$ | $L_4$ |
|---|---|---|---|---|---|---|---|---|---|---|---|---|
| 1 | 0 | 1 | 1 | 0 | 1 | $\frac{G_5}{G_4}$ | 0 | 0 | 1 | 0 | 0 | 1 |
| 2 | 1 | $\sqrt{2}$ | 1 | 1 | $\sqrt[4]{2 \cdot \frac{G_5}{G_4}}$ | $\sqrt{\frac{G_5}{G_4}}$ | 0 | 0 | 1 | 0 | 0 | 1 |
| 3 | 0 | 1 | 1 | 0 | 1 | $\sqrt[3]{\frac{G_5}{G_4}}$ | 1 | 1 | 1 | 1 | $\sqrt[3]{\frac{G_5}{G_4}}$ | $\sqrt{\left(\frac{G_5}{G_4}\right)^2}$ |
| 4 | 1 | $2\cos\left(\frac{\pi}{8}\right)$ | 1 | 1 | $2\cos\left(\frac{\pi}{8}\right)\sqrt[4]{\frac{G_5}{G_4}}$ | $\sqrt{\frac{G_5}{G_4}}$ | 1 | $2\cos\left(\frac{3\pi}{8}\right)$ | 1 | 1 | $2\cos\left(\frac{3\pi}{8}\right)\sqrt[4]{\frac{G_5}{G_4}}$ | $\sqrt{\frac{G_5}{G_4}}$ |

FILTER WITH INDEPENDENTLY ADJUSTABLE BAND GAIN AND BREAK POINT SLOPES AND METHOD OF CONSTRUCTING SAME

CROSS-REFERENCE TO RELATED APPLICATIONS

This application claims the benefit of U.S. Provisional Patent Application No. 61/829,988 filed May 31, 2013, which is incorporated herein by reference.

BACKGROUND

The present invention generally relates to loudspeaker systems and more particularly to systems and method of equalizing the frequency response of loudspeaker systems.

Equalization is a well-known and widely used process of adjusting the frequency response of a loudspeaker. To "equalize" a loudspeaker system is to adjust the amplitude of the audio signal a different frequencies within the system's operating frequency range in order to correct for frequency dependent distortions and anomalies that appear in the frequency response of the system. Distortions in the frequency response can, for example, be introduced by components of the loudspeaker system itself or by the acoustic environment in which the system is used. Equalization can also be used to adjust the frequency response to achieve a desired audio experience, for example, to create a particular sound for a particular performance at a particular venue.

Equalizers are implemented using linear filters that alter the frequency response of the loudspeaker system within specific bands of frequencies. Different filtering techniques have been devised, each providing different capabilities. Standard first order shelving filters are often used for basic treble and bass controls in consumer products.

For more sophisticated applications, control is increased by increasing the number of frequency bands that can be manipulated by the user. The more bands the more control. And the more controllable each band is the greater the capability is to fine tune the frequency response. With conventional equalization schemes the gain (cut or boost) within each frequency band gain can be readily controlled. However, this is not true with the shape of the bands at the bands break point frequencies. Each break point will be characterized by a slope, typically specified in terms of dB/octave and the shape of the band can be adjusted by adjusting this slope. The slope will be relatively gradual where lower order liken; are used and will become increasingly steep as the order of the filters increases. Control over the shape of the bands would give the operator increased flexibility to fine tune the system's frequency response to achieve desired sonic experiences. However, with conventional equalization schemes, user adjustments to the slope at the frequency break points cannot be made without simultaneously changing the band gain, an unworkable condition in practice. This limits the equalizer's capability to render fine adjustments in the response of an audio system.

SUMMARY OF THE INVENTION

The invention is directed improvements in filters used for loudspeaker equalization and to a method of constructing such improved filters. The invention has particular application in multiband equalizers, but could be implemented to construct a single band filter of a single filtering section of a multiband filter. A filter implemented in accordance with the invention allows the user of an equalizer to independently adjust the band gain within a frequency band and the break point slopes for the frequency band, implemented as a multiband filter, the user can independently adjust the band gain within each frequency band and the break point slopes for each band of the multiband filter. The filter can be implemented digitally using cascaded digital biquad filters sections as hereinafter described.

A filter in accordance with the invention is comprised of at least one band filter section comprised an n-order high boost or cut shelving filter having a break point frequency, $\omega_1$, and an n-order low boost or cut shelving filter having a break point frequency, $\omega_2$, wherein $\omega^1 < \omega_2$ The order, n, of at least one, and preferably both of the shelving filters of the at least one band filter section can be selected for adjusting the slope of the shelving fitter at one or both of its break point frequencies. The high and low shelving filters forming the at least one band filter section have substantially the same gain and produce a resultant band gain for the band filter section. Gain correction means are provided for the selectable n-order high shelving filter and n-order low shelving filter for correcting the resultant band gain to a base gain level. Such correction means provides a correction factor dependent on the order of the shelving filters selected.

User controlled shelving order selection means allow for setting the order, n, of one or both of the high and low shelving filters making up the at least one band filter section. By selecting the order of the shelving filters making up the band filters, the break point slope at the shelving filter's break point frequency can be adjusted. Additional user control means can be provided for adjusting the base gain of the gain corrected band of each band filter section. The gain adjustments and break point slope adjustments can be made independently without one affecting the other.

Most suitably, the filter in accordance with the invention is a multiband filter comprised two or more band filter sections, each of which is comprised of at least one of the following: a n-order high boost and cut shelving filters having break point frequency, $\omega_1$, and selectable n-order low boost and cut shelving filter having a break point frequency, $\omega_2$, wherein $\omega_1 < \omega_2$. The order of at least one, and preferably all of the shelving filters can be selected for adjusting the slope of the shelving filter at the break point frequency. The selectable high and/or low shelving filters forming any one band filter section have substantially the same gain and produce a resultant band gain for the band filter section. Gain correction means are provided for each selectable n-order high shelving filter and n-order low shelving filter for correcting the resultant band gain to a base gain level. Such correction means provides a correction factor dependent on the order of the shelving filters selected.

User controlled shelving order selection means allow for setting the order, n, of one or both of the high and low shelving filters making up each band section. By selecting the order of the shelving filters making up any one of the band filters of the multiband filter, the break point slope at the shelving filter's break point frequency can be adjusted. Additional user control means can be provided for adjusting the base gain of the gain corrected band of each band filter section. The vain adjustments and break point slope adjustments can be made independently without one affecting the other.

Break point slopes can be user adjusted by switching between available n-order boost and cat shelving filters making up each band filter section. For example, selectable n-order high and low shelving fillers can be provided for n=1 (first order filter), n=2 (second order filter), n=3 (third order filter), etc. These selectable n-order filters would provide for selectable break point slopes of 6 dB/octave, 12 dB/octave, 18 dB/octave etc. The band could be symmetric (the selected break point slopes are the same) or asymmetric (the selected break point slopes are different. Also by setting the gains of adjacent bands to the same setting a breakpoint can be eliminated. In this case the adjacent equalization band would combine into a single wider band, whose breakpoint slopes could be adjusted.

In another aspect of the invention, a method of constructing n-order high and low shelving filters for a multiband filter having desired break point frequencies is provided for different values of n. The method involves choosing as a basic building block it first order (n=1) frequency-normalized shelving filter for providing a basic shelving shape and gain level. Selectable higher order shelving filters are then created which maintain the basic shape of the first order filter except for the slope at the filters frequency break point frequency. To construct each higher order shelving filter, e.g. second order, third order, and fourth order shelving filters, the complex s-plane representation of a frequency-normalized n-order Butterworth-type filter is established as represented by complex poles on a unit circle about the origin of the s-plane. Complex zeros are then added to these complex poles and manipulated on the s-plane to achieve a gain that maintains the basic gain level of the first order filter, but with an altered break-point frequency slope. To obtain this result, the complex zeros can be moved away from their associated pole and the origin of the s-plane on a line that passes through the pole and s-plane origin. Each zero is moved the same distance with the distance being chosen to achieve a desired gain. This method can be used to derive the parameters of the n-order filters for the multiband filter in accordance with the invention for n=2 and greater, which includes a gain correction factor to each higher order filter that normalizes the gain of the higher order filter to the gain of the first order shelving filter.

Gain correction factors can be determined for high and low boost and cut shelving filters. Suitably, gain correction factors can first be determined for the low boost-gain order shelving filter, and then the gain correction factors for the cut-gain low-pass and boost and cut high-pass filters derived therefrom.

Using the multiband filters and method of the invention different break point frequency slopes can be selected for a high shelving filter and a low shelving filter. Thus, the high frequency end of a vain band can be given a different shape, that is, break point frequency slope than the low frequency end of the gain band. This added flexibility will afford the user of the equalization system to fine tune the shape of either end of a gain band, again independently of the gain.

BRIEF DESCRIPTION OF THE DRAWINGS

FIG. 10A-10H provide tables of coefficients that can be used in the transfer functions for the biquads for different, implementations of each shelving filter shown in the block diagram in FIG. 9.

DETAILED DESCRIPTION

Filters in accordance with the invention will generally be employed in equalization systems for adjusting the frequency response of a loudspeaker system. The invention involves different combinations of standard first order shelving filters and non-standard higher order shelving filters. The architecture of the resulting filters can be used to transform the filter architecture of current audio control systems into digital biquad sections, resulting in expanded filtering capabilities, including the ability to shape frequency response at break point frequencies of a multiband system.

As used herein, band filter will be understood to include a boost band filter and a cut band filter. In the band filter described herein the amount of boost or cut for the band is adjustable.

Figure 1:
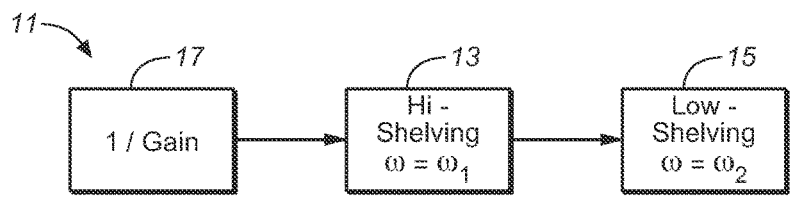
FIG. 1 is a block diagram of two cascaded high and low shelving filters for a multiband filter in accordance with the invention showing a gain correction factor (1/gain) in line with the shelving filters.

FIG. 1 illustrates in block diagram form the most basic implementation of a filter in accordance with the invention in a single band filter section 11 comprise of a high boost or cut shelving filter 13 having a break point frequency, $\omega_1$, and an low boost or cut shelving filter 15 having a break point frequency, $\omega_2$, where $\omega_1 < \omega_2$. As hereafter described, the order of the high and low shelving filters can be separately adjusted to adjust the slope of the filters at the shelving filters breakpoint frequencies $\omega_1$ and $\omega_2$. Gain correction, denoted by block 17 is provided for adjusting the boost or cut gain of the band filter section independently of slope adjustment at the breakpoints of the hi-pass and low shelving filters. With this basic implementation in mind the principles of the basic and higher order shelving filters used in the invention are now described.

Basic Shelving Filter

First it is noted the user requirements for a multiband equalization will require asymmetric band filters. Building such filters can be accomplished using different combinations of standard first order and non-standard high order shelving filters. Using such shelving filters as building blocks, filter architectures can be created which can be transformed into digital, biquad sections that are flexible and can be cascaded to provide adjustment controls contemplated by the invention.

First, the basic building block of the filters of the invention needs to be defined. That is, the low boost shelving filter. From this basic building block all the derivations for low-pass and boost gain frequency-normalized prototypes ($\omega=1$) can be obtained. Later the tow-pass to high-pass and boost to cut transforms from this prototype will be derived.

A basic first order low boost-gain frequency-normalized shelving filter is a well-known filter, and is given, in the analog domain, by:

$$H(s) = \frac{s + G_0}{s + 1}$$

Where $G_0$ is a gain parameter which determines the amplification at $\omega=0$.

By substituting $j\omega$ in the above transfer function, it can be seen how the parameter $G_0$, that is, the desired gain at DC, determines the position of the zero. When $\omega=0$, the transfer function becomes:

$$H(j\omega) = \left| \frac{j\omega + G_0}{j\omega + 1} \right|_{\omega=0} = \frac{G_0}{1}$$

Figure 2A:
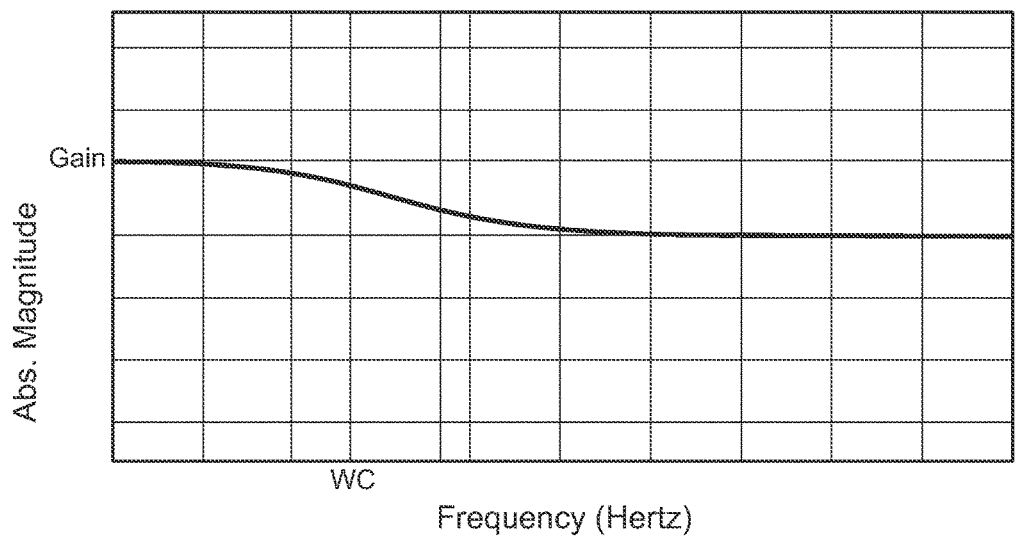
FIG. 2A is a graph of a frequency response curve for a first order low boost gain shelving filter such as forms the basic building block of a multiband filter in accordance with the invention.
Figure 2B:
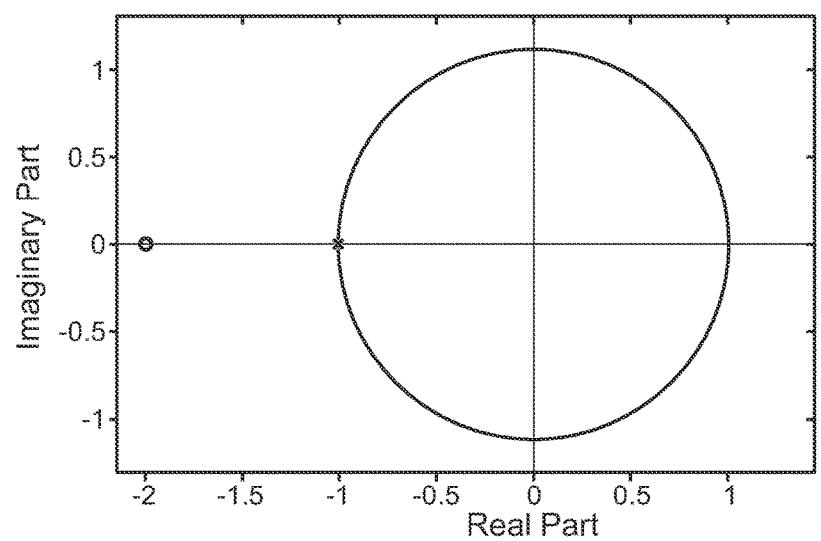
FIG. 2B is an s-plane representation of the poles and zeros therefor, with the frequency normalized to $\omega=1$.

The frequency response for this shelving filter is shown in FIG. 2A. The s-plane representation of the poles and zeros of the filter are shown in FIG. 2B, where the zero is seen to be on a straight line from the origin, namely, on the real axis.

Higher Order Shelving Filters

In order to construct higher order shelving filters, one starts from a general Butterworth low-pass filter and then just add complex zeros to the complex poles in order to stop the monotonic attenuation at the desired points. For example, for a second order shelving filter, one starts with a Butterworth second order low pass prototype:

$$H(s) = \frac{1}{s^2 + \sqrt{2}\,s + 1}$$

Figure 3A:
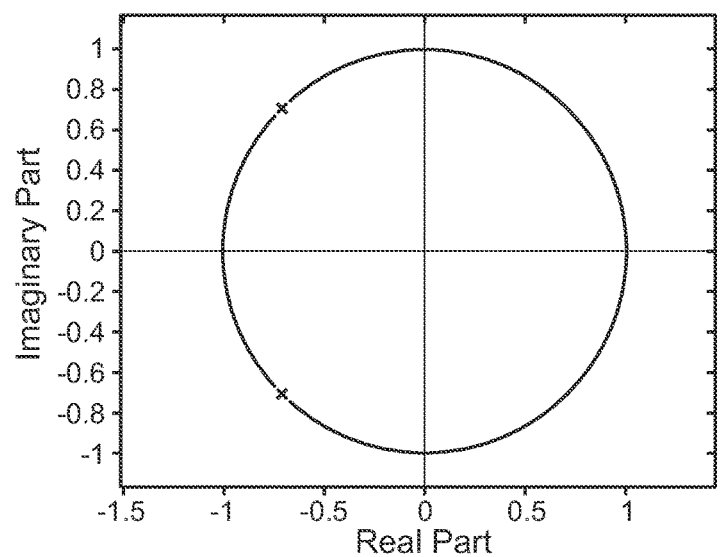
FIG. 3A is an s-plane representation of the poles for a general second order Butterworth low-pass filter.

The s-plane representation of the poles and zeros of this second order filter are shown in FIG. 3A. Adding zeros to above transfer function yields the following:

$$H(s) = \frac{b_2 s^2 + b_1 \sqrt{2}\,s + b_0}{s^2 + \sqrt{2}\,s + 1}$$

Figure 3B:
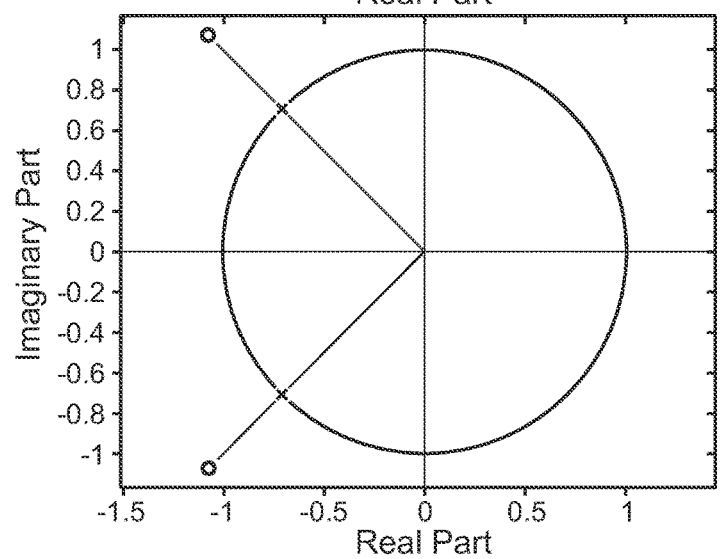
FIG. 3B is another s-plane representation of the poles therefor with the zeros added to the s-plane outside of and in line the poles and the origin of the s-plane for producing a gain corrected second order low shelving filter.
Figure 3D:
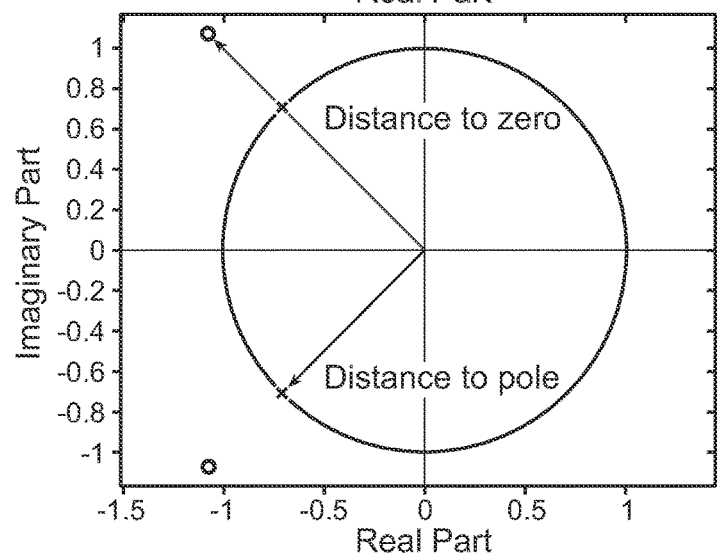
FIG. 3D is an s-plane representation for the second order filter as shown in FIG. 3B, showing the distance to the poles as compared to the distance to the zeros.
Figure 3C:
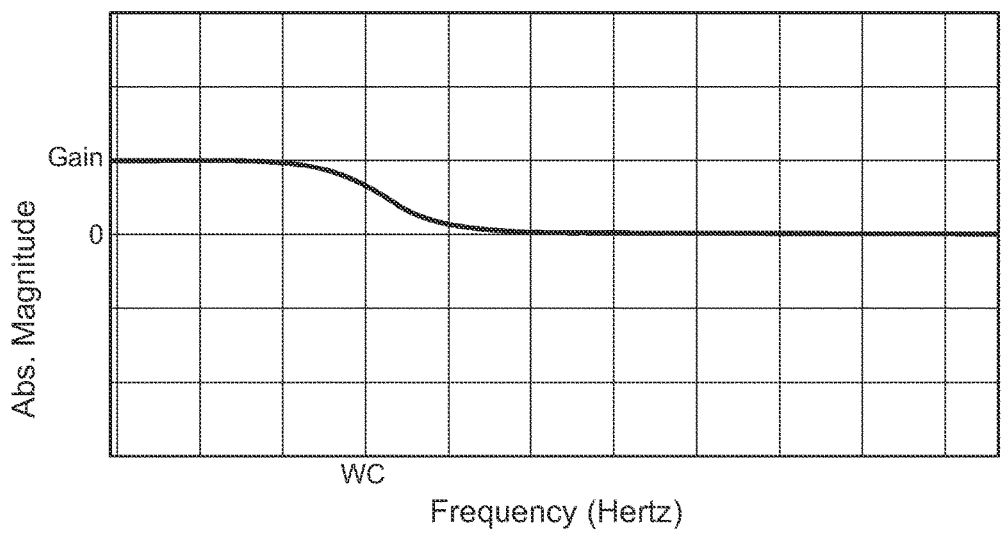
FIG. 3C is graph of the frequency response curve therefor.

If, as depicted in s-plane representation in FIG. 3B, the zeroes are added on straight lines from the origin, the frequency response in FIG. 3C can be achieved.

But now there are complex poles and zeros which need to be taken into account, and thus the relationship between the position of the zeros and the desired gain need to be obtained. This relationship can be obtained with a useful trick: The magnitude of the s function for any given frequency $\omega$ can be obtained by just measuring the distance from poles and zeros to the $\omega$ points of the $j\omega$ axis. The magnitude of the function will be:

$$|H(j\omega)| = \frac{dz_1 \cdot dz_2 \cdot \ldots \cdot dz_n}{dp_1 \cdot dp_2 \cdot \ldots \cdot dp_n}$$

Where $dp_n$ is the distance from 'pole n' to the $\omega$ points at the $j\omega$ axis and $dz_n$ is the distance from 'zero n' to the $\omega$ points at the $j\omega$ axis. In the second order shelving filter example, the magnitude at $\omega=0$ will be the product of the distances from all zeros to the point $(0,0)$ divided by the product of the distance from all poles to the point $(0,0)$. This is illustrated in the s-plane representation for the second order filter shown in FIG. 3D.

The above trick can be used to obtain the relation between the gain parameter $G_0$ and the position of the zeros. As illustrated in FIG. 3D, the poles all fall on a unit circle, so distance to all of the poles are equal to one. At $\omega=0$, one wants to obtain a desired gain. The gain parameter can be obtained from the following equation:

$$|H(j\omega)|_{\omega=0} = \frac{dz_1 \cdot dz_2}{1}$$

As the distance to the point $(0,0)$ is the same for both zeros, one can get the position of the zeros related with the desired gain parameter:

$$dz_0 = \sqrt{G_0}$$

The relation of the zeros to the desired gain can now be substituted for the zeros of the second order equation. First the zeros can be put into rectangular form to make it easier to operate on them geometrically. One starts by putting the zeros at the same position as the poles:

$$s^2 + \sqrt{2}\,s + 1 = 0$$

The roots of the equation are:

$$z_1 = -\frac{\sqrt{2}}{2} + \frac{\sqrt{2}}{2}j$$

$$z_2 = -\frac{\sqrt{2}}{2} - \frac{\sqrt{2}}{2}j$$

Then, to move the zeros in a straight line, one just needs to multiply their real and imaginary components by the obtained parameter, which is related with the desired amplification at $\omega=0$:

$$z_1 = \sqrt{G_0} \cdot \left(-\frac{\sqrt{2}}{2} + \frac{\sqrt{2}}{2}j\right)$$

$$z_2 = \sqrt{G_0} \cdot \left(-\frac{\sqrt{2}}{2} - \frac{\sqrt{2}}{2}j\right)$$

By multiplying again the zeros, one gets the second order equation that he or she is looking for:

$$(s-z_1)\cdot(s-z_2) = s^2 + \sqrt{2 \cdot G_0}\,s + G_0$$

The final second order shelving equation will be then:

$$H(s) = \frac{s^2 + \sqrt{2 \cdot G_0}\,s + G_0}{s^2 + \sqrt{2}\,s + 1}$$

The same technique can now be used to obtain third and fourth order shelving filters. For third order filter, the low pass Butterworth prototype, split in second order sections, is:

$$H(s) = \frac{1}{s+1} \cdot \frac{1}{s^2+s+1}$$

The three poles of this transfer function are:

$$p_1 = -\frac{1}{2} + \frac{\sqrt{3}}{2}j$$

$$p_2 = -\frac{1}{2} - \frac{\sqrt{3}}{2}j$$

$$p_3 = -1$$

Figure 4A:
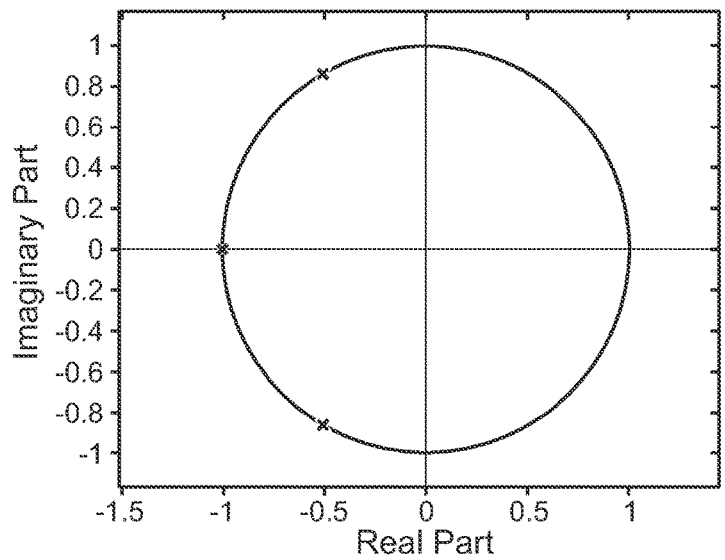
FIG. 4A is an s-plane representation of the poles for a general third order Butterworth low-pass filter.

The s-plane representation of this poles is shown in FIG. 4A.

By using the same approach, zeros can be placed at the same position as the poles:

$$H(s) = \frac{s+1}{s+1} \cdot \frac{s^2+s+1}{s^2+s+1}$$

Figure 4B:
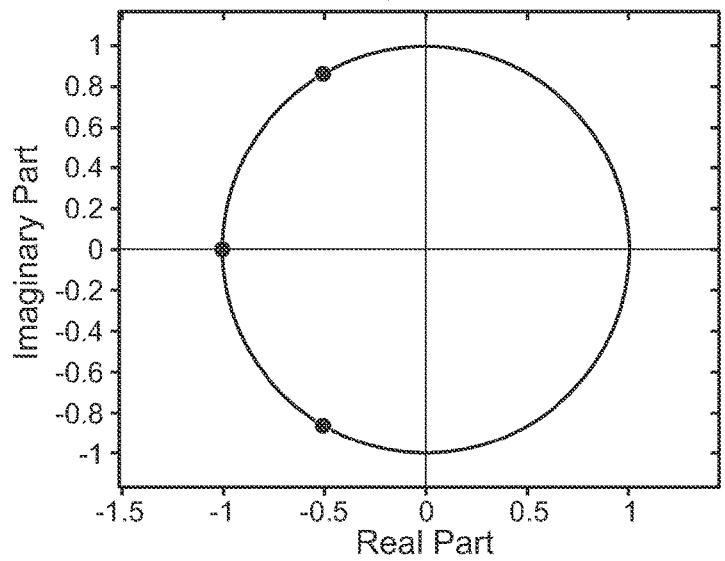
FIG. 4B is another s-plane representation thereof with the zeros added to the s-plane which are coincident with the three poles of the third order filter.

The resulting s-plane representation is shown in FIG. 4B.

Figure 4C:
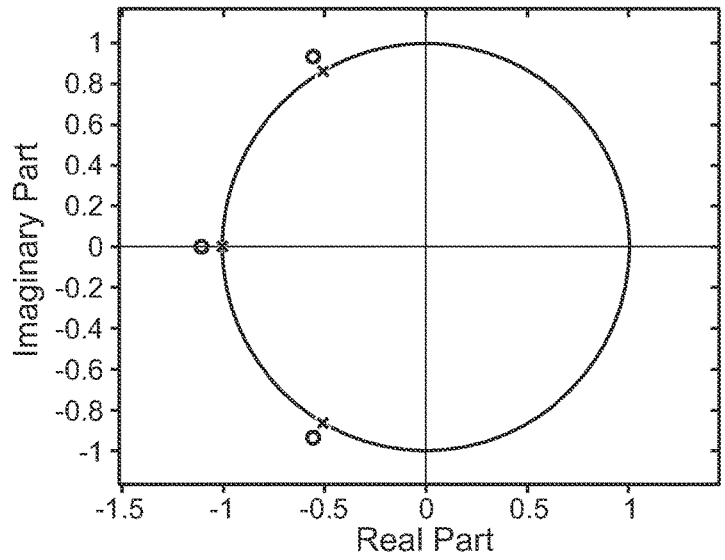
FIG. 4C is further s-plane representation thereof with the added zeros moved outside of the poles but kept in-line with the poles and the origin of the s-plane.

And now the desired gain can be related to the distance to all zeros by moving the zeros in a straight line from the origin (0,0) as illustrated in FIG. 4C. By moving the zeros in this fashion the shape of the shelving filter can by maintained. Again, all of the poles fall on a unit circle, but now there are three poles and three zeros. The relation for associating the distances to gain control will then be:

$$|H(j\omega)|_{\omega=0} = \frac{dz_1 \cdot dz_2 \cdot dz_3}{1}$$

The distance to the point (0,0) is again the same for the three zeros, so the relation of the gain control parameter at DC in relation to the zero position will be:

$$dz_n = \sqrt[3]{G_0}$$

If that parameter is included, to control the zero's position in the above third order equation, by using the same geometric approach than was done for the second order filter:

$$z_1 = \sqrt[3]{G_0} \cdot \left(-\frac{1}{2} + \frac{\sqrt{3}}{2}j\right)$$

$$z_2 = \sqrt[3]{G_0} \cdot \left(-\frac{1}{2} - \frac{\sqrt{3}}{2}j\right)$$

$$z_3 = \sqrt[3]{G_0}$$

By getting again the s equations, one finally obtains:

$$H(s) = \frac{s + \sqrt[3]{G_0}}{s+1} \cdot \frac{s + \sqrt[3]{G_0}\,s + \sqrt[3]{G_0^2}}{s^2+s+1}$$

Following the same steps to obtain the fourth order filter, the low pass Butterworth prototype, split in second order sections, is:

$$H(s) = \frac{1}{s^2 + 2\cdot\cos\left(\frac{3\pi}{8}\right)s + 1} \cdot \frac{1}{s^2 + 2\cdot\cos\left(\frac{\pi}{8}\right)s + 1}$$

Figure 5A:
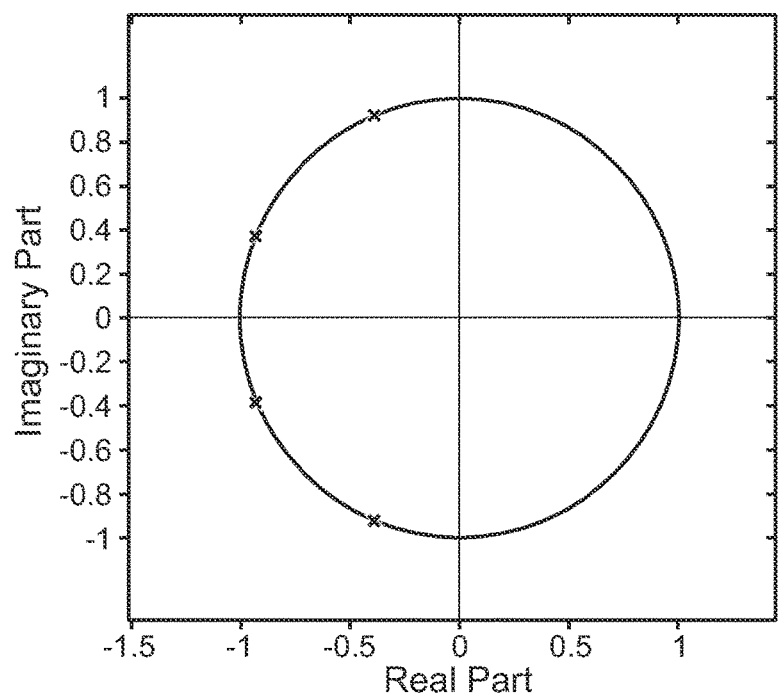
FIG. 5A is an s-plane representation of the poles for a general forth order Butterworth low-pass filter.
Figure 5B:
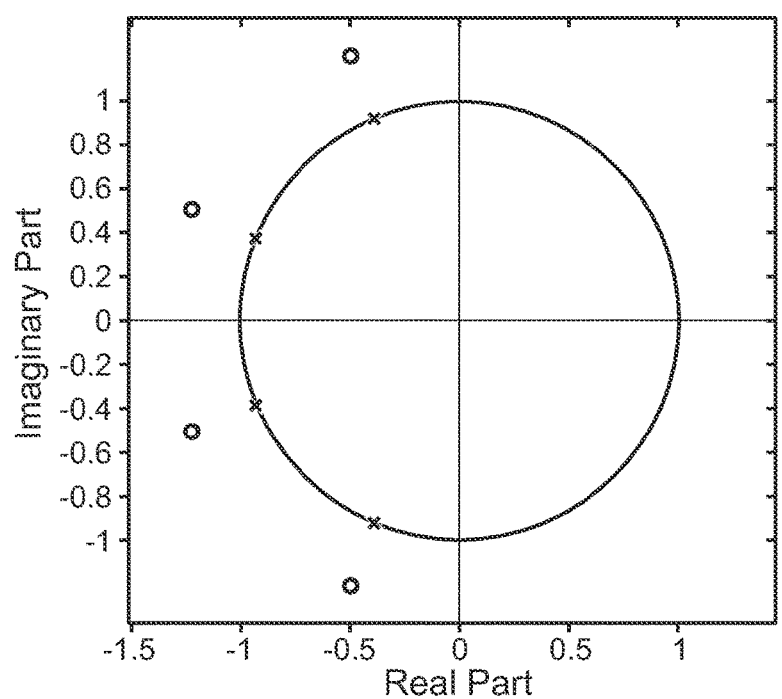
FIG. 5B is another s-plane representation of the poles therefor with the zeros added to the s-plane outside of and in-line with the poles and the origin of the s-plane for producing a gain corrected fourth order low shelving filter.

The s-plane representation of this transfer function is shown in FIG. 5A, which shows four poles. Adding four zeros and adhering, to the requirement that the zeros fall on a straight line passing through the origin results in an s-plane representation as shown in FIG. 5B.

Therefore the relation of the position of the zeros with the DC amplification parameter will be given by:

$$|H(j\omega)|_{\omega=0} = \frac{dz_1 \cdot dz_2 \cdot dz_3 \cdot dz_4}{1}$$

Once again, The distance to the point (0,0) is again the same for the four zeros, so the relation of the gain control parameter at DC in relation to the zero position will be:

$$dz_3 = \sqrt[4]{G_0}$$

The following transfer function for the fourth order shelving filter prototype is finally obtained by putting the complex zeros in rectangular form, by introducing the obtained gain parameter and again by obtaining the second order functions in s domain as described above:

$$H(s) = \frac{s^2 + \left(2\cdot\cos\left(\frac{3\pi}{8}\right)\cdot\sqrt[4]{G_0}\right)s + \sqrt{G_0}}{s^2 + 2\cdot\cos\left(\frac{3\pi}{8}\right)s + 1} \cdot \frac{s^2 + \left(2\cdot\cos\left(\frac{\pi}{8}\right)\cdot\sqrt[4]{G_0}\right)s + \sqrt{G_0}}{s^2 + 2\cdot\cos\left(\frac{\pi}{8}\right)s + 1}$$

Any higher order filters can be obtained by following the same approach.

Boost to Cut Transform

All the obtained filters have their cutoff normalized frequency at $\omega c=1$ only in the case of boosting the gain at DC ($G0>1$). If cutting, gain is desired with the above equations (i.e $G0<1$) $\omega_c$ is moved to lower frequencies. In order to keep a symmetric frequency response for boost and cut, the transfer function needs to be inverted in the case of cut by swapping the poles and the zeros. Also, $G_0$ needs to be replaced by $1/G_0$ by again using the distances to poles and zeros trick to get the magnitude response. When cut is desired, $G_0$ is always less than 1.

Low to High Transform

All the filters obtained in the manner discussed above are low pass prototypes. In order to obtain the equivalent high pass filters, a low-pass to high-pass transformation must be done. The low-pass to high-pass transformation is obtained by just substituting 1/s for s. For example, by making this substitution the transfer function of a boost first order high-pass filter becomes:

$$H(s) = \frac{G_0 s + 1}{s + 1}$$

The same transformation must be applied to all other equations for boost and cut filters in order to obtain the high-pass filter prototypes.

Asymmetric Band Filters

In practical applications, asymmetric band filters are needed. Such asymmetric filters can be obtained from the above described building blocks.

Figure 6A:
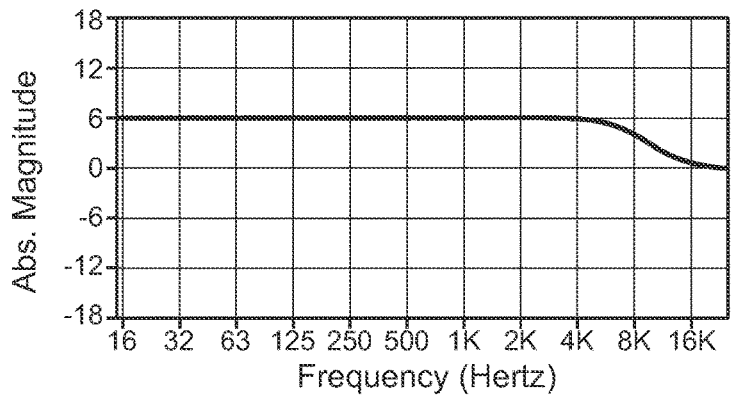
FIG. 6A is a frequency response curve for an n-order low shelving filter with a boost gain of 6 dB.
Figure 6B:
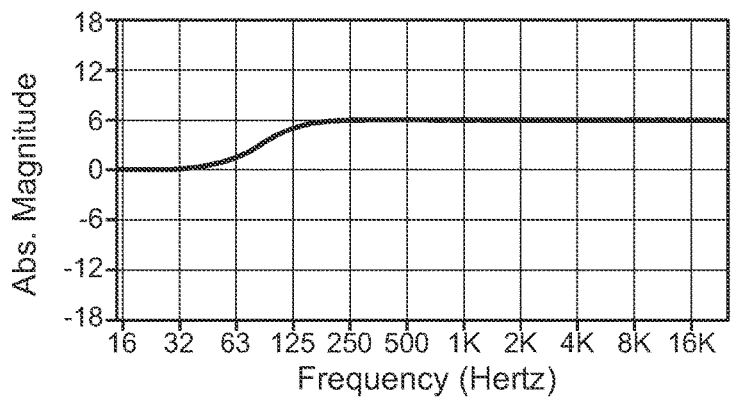
FIG. 6B is a frequency response curve for an n-order high shelving filter with a boost gain of 6 dB.
Figure 6C:
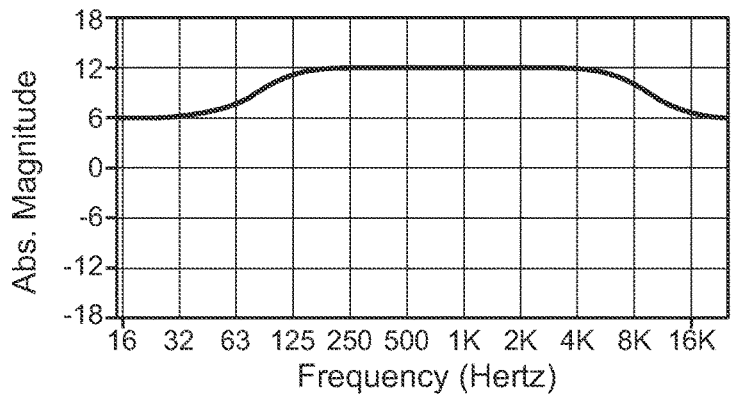
FIG. 6C is the frequency response curve of a pass-band filter comprised of cascaded n-order low and high shelving filters having the responses shown in FIGS. 6A and 6B, which produce the desired frequency response, but before gain correction.

Starting with the boost example, the band filter can be easily created by connecting in series a high and a low shelving filter with the same boost gain. The frequency response of the low shelving filter is shown in FIG. 6A and frequency response of the high is shown in FIG. 6B. It is noted that the cutoff or break frequency for the low pass must be higher than the cutoff frequency for the high filter. The frequency response of the series (or cascaded) connected (or cascaded) is shown in FIG. 6C. In FIG. 6A it is seen that the cutoff frequency $\omega_1$ for the high shelving filter is 100 Hz, in FIG. 6B it is seen that the cutoff frequency $\omega_2$ for the low shelving filter is 8000 Hz. These cutoff frequencies become the breakpoint frequencies of the pass-pass filter created by the two shelving filters as seen in FIG. 6C.

Figure 6D:
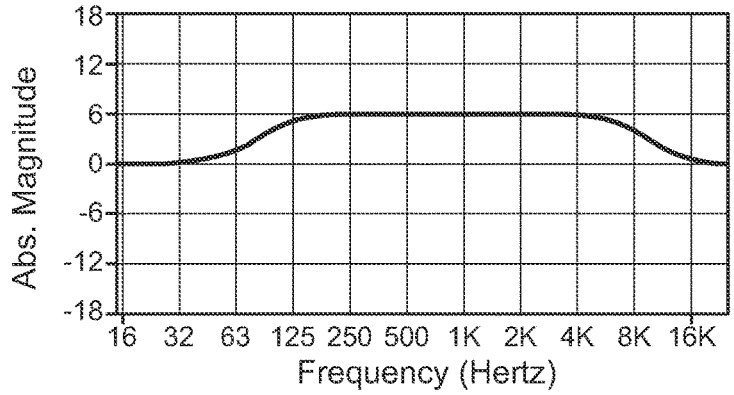
FIG. 6D is the frequency response curve thereof after gain correction.
Figure 7:
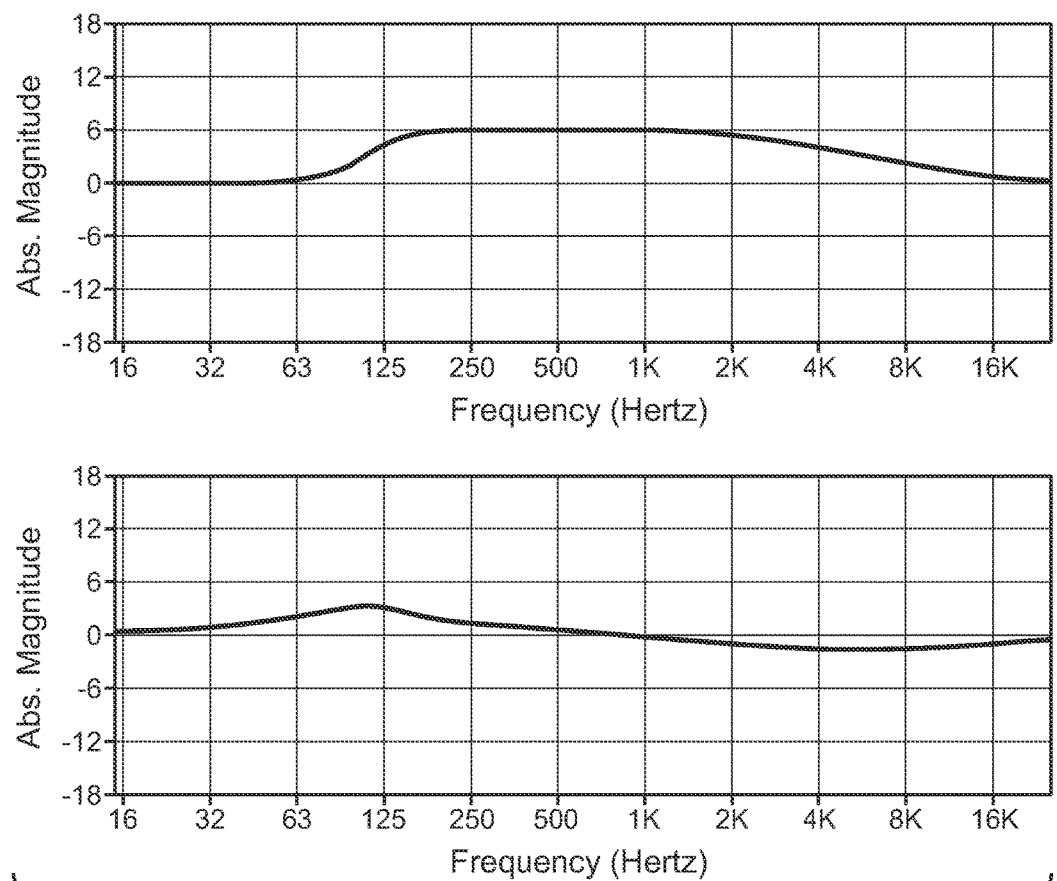
FIG. 7 is the frequency response curve and phase response of a pass-band filter comprised of cascaded low and high shelving filters of different orders for producing an asymmetric band filter.

To achieve the desired gain form the band filter created in this manner will require gain adjustment. More specifically, the convolution of the series connected high and low shelving filters leads to a total gain in the band, and also out of the band. Generally, the desired gain will be the gain of the original high and low shelving filters. However, without corrections the gain of the cascaded filters will be the square of the gain of the original filters as seen in FIG. 6C, where the original filters provide gain of 6 db and the cascaded filters provide a gain of 12 db. (This occurs because the filters are cascaded and the gain of each shelving filter is multiplied in the frequency domain.) To obtain the desired gain, a gain correction factor, 1/gain, can be added in series with the high and low filters. Providing such a correction factor to the cascaded shelving filters having a frequency respond as shown in FIG. 6C will result in the frequency shown in FIG. 6D, the ban gain has been corrected back to 6 db. The simple implementation of such gain corrected pass-band filter just described is shown in the earlier described block diagram in FIG. 1. Using this simple structure, a band filter can be created with different higher order shelving filters to achieve different slopes at the two cutoff frequencies $\omega_1$ and $\omega_2$ of the composite band. And the slope at $\omega_1$ can be different for the slope at $\omega_2$ to create an asymmetric band. An example of a frequency and phase response for an asymmetric pass-band filter is shown FIG. 7, wherein f1=125 Hz, step1 (slope)=18 dB/octave, f2=4000 Hz, step2=6=6 dB/octave, and wherein the gain=6.

The above-described building blocks for filters in accordance with the invention can implemented using biquads. The biquad coefficients A to F are the analog second order section prototypes, and a complete bilinear transform is applied to each second order section in order to get the digital filter. Therefore, every pass-band region can be created with just 4 biquads, allowing independent step selections of 6 dB/octave to 24 dB/octave.

Figure 8:
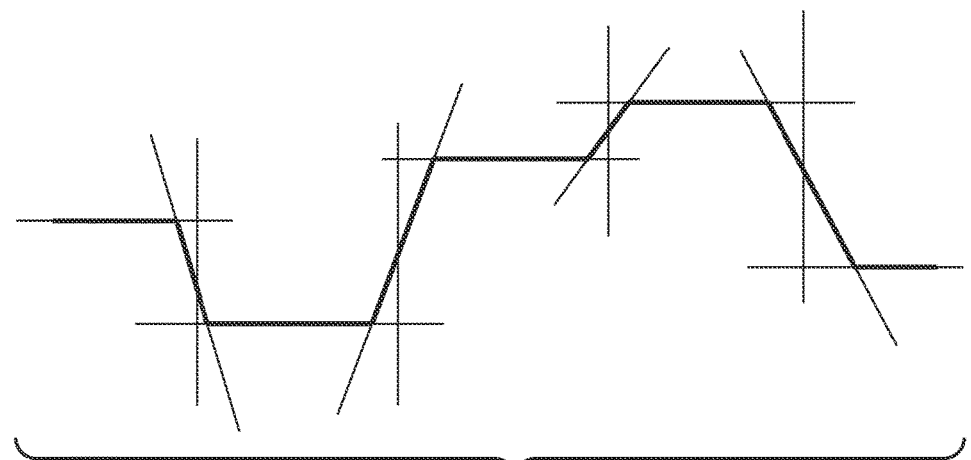
FIG. 8 is a graphical representation of a multiple gain bands and breakpoints with adjustable breakpoint slopes that can be produced with a multiband filter multiband filter in accordance with the invention.

FIG. 8 graphically illustrates multiple gain bands and break points that can be produced by a multiband filter in accordance with the invention, and specifically shows five gain bands and four frequency breakpoints. The slopes of each of the breakpoints can be independently adjusted by selecting the order of the shelving filter associated with the breakpoint. For example, selectable order of the shelving filter could be $1^{st}$ order, $2^2$ order . . . up through an eighth order high and low shelving titters. The filters would be boost or cut filters as required. A gain band be bypassed by setting, the gains on the left and right of the band to the same gain.

Figure 9:
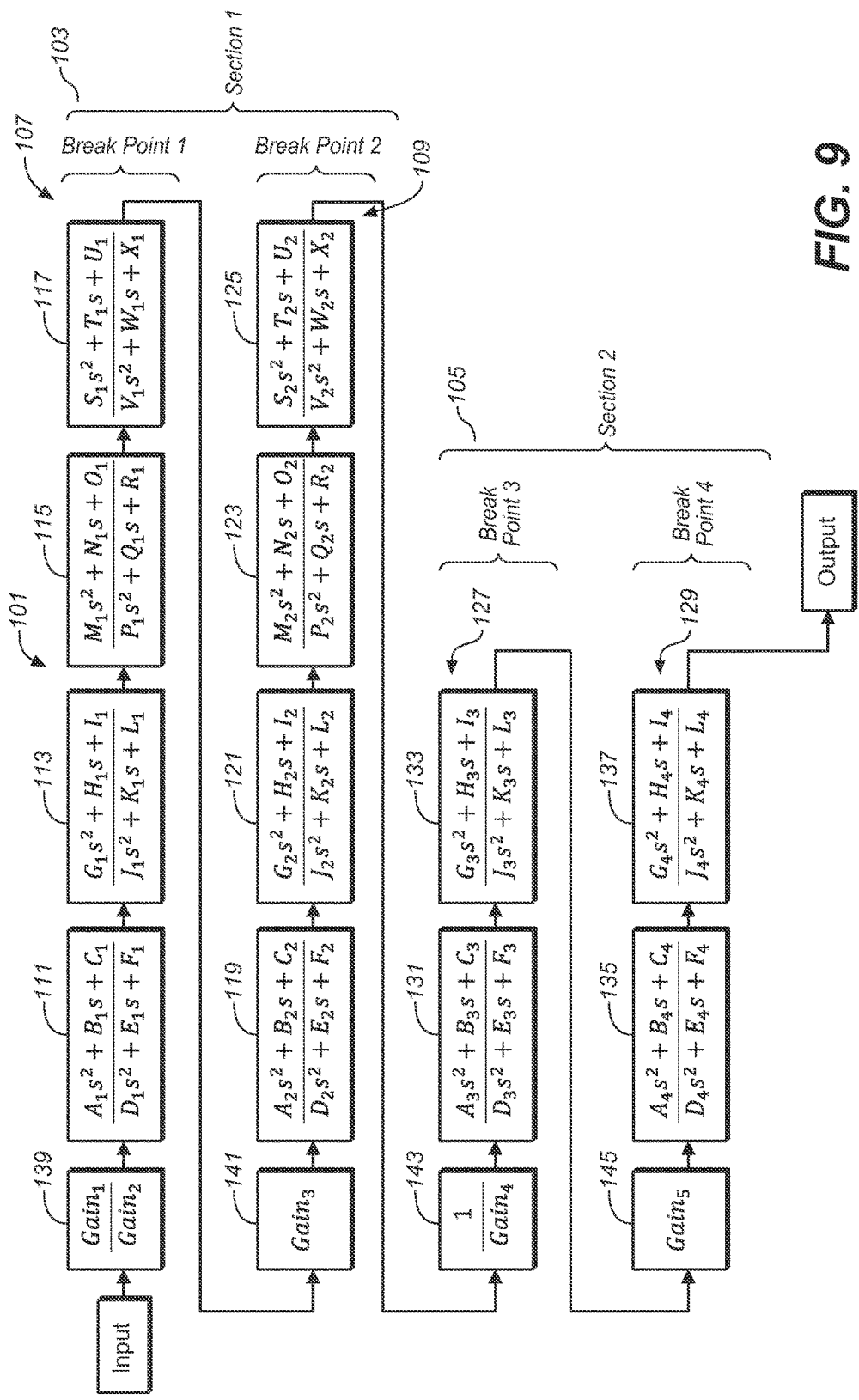
FIG. 9 is a block diagram of a biquad implementation of an exemplary multiband filter in accordance with the invention made up of two sections, each of which has an n-order high and low shelving filter, were the order of the shelving filter is selectable.

FIG. 9 illustrates a filter in accordance with the invention comprised of two sections. Each section is associated with a gain band and is comprised of a high shelving filter, a low shelving filter and gain correction for each of these shelving filter. Each shelving filter is associated with a break point frequency and is implemented by cascaded biquads characterized by transfer functions. The coefficients of transfer function for each biquard can be altered to establish the desired property of the shelving filter, such as the order of the filter and whether it has a boost or cut gain characteristic.

More specifically, the illustrated filter, generally denoted by the numeral 101, has a first section 103 and a second section 105. The first section has a high shelving filter portion 107 having a first break point frequency (break point 1) implemented by biquad blocks 111, 113, 115, 117, and a low shelving filter portion 109 connected is series to the high shelving filter portion. The low shelving filter portion 109 has a second breakpoint frequency (break point 2) and is implemented by biquad blocks 119, 121, 123, 125. The second section is connected in series to the first section and is comprised of a high shelving filter portion 127 having a third break point frequency (break point 3) implemented by fewer biquad blocks 131, 133, and a low shelving filter portion 129 connected is series to the high shelving filter portion 127. The low shelving filter portion 129 has a fourth breakpoint frequency (break point 4) and is implemented by the two biquad blocks 135, 137.

Gain correction for each of the shelving filters is provided by the series connected gain correction block 139, 141, 143, 145, associated, respectively, with shelving filters 107, 109, 127, and 129.

Each of the biquads blocks for each of the shelving filters illustrated in FIG. 9 has a transfer function as indicated in each block. And the several transfer functions for the shelving filter have coefficients A, B, . . . , X in the case of filter section 1, and coefficients A, B, . . . L, in the case of filter section 2. By manipulating these coefficients, the characteristics of each filter section can be set and adjusted. In particular they can be set and adjusted so that the high and low shelving filters making up each filter section can be configured into selectable n-order boost or cut shelving filters, where n ranges from 1 to 8.

FIGS. 10A-10H provide in table form different combinations of coefficients for establishing a range of different filter characteristics, including the slope in the frequency response at each of the breakpoint frequencies of the filter architecture shown in FIG. 9. FIG. 10A shows the coefficients needed for break point 1 (produced by a high shelving filter) for the boost case for 8 different selectable slopes (slopes 1-8), wherein slope 1 results from a first order high shelving filter, slope 2 results from a second order high shelving filter etc. up to the eighth order shelving filter (slope 8). FIG. 10B shows the coefficients needed for breakpoint 1 for the cut case for 8 different selectable slopes (again slopes 1-8).

FIGS. 10C and 10D similarly show the coefficients for the boost and cut cases for break point 2 (produced by a low shelving filter) for 8 different selectable slopes.

FIGS. 10E and 10F show the coefficients needed for break point 3 (produced by a high shelving filter) for the boost and cut cases for four different slopes. It is noted that the reduced number of available slopes in this case is due to the reduced number of biquad sections used to implement the shelving filters in this second filter section. FIGS. 10G and 10H show the coefficients needed for break point 4 (produced by a low shelving filter) for boost and cut cases, again for four different slopes.

Figure 11:
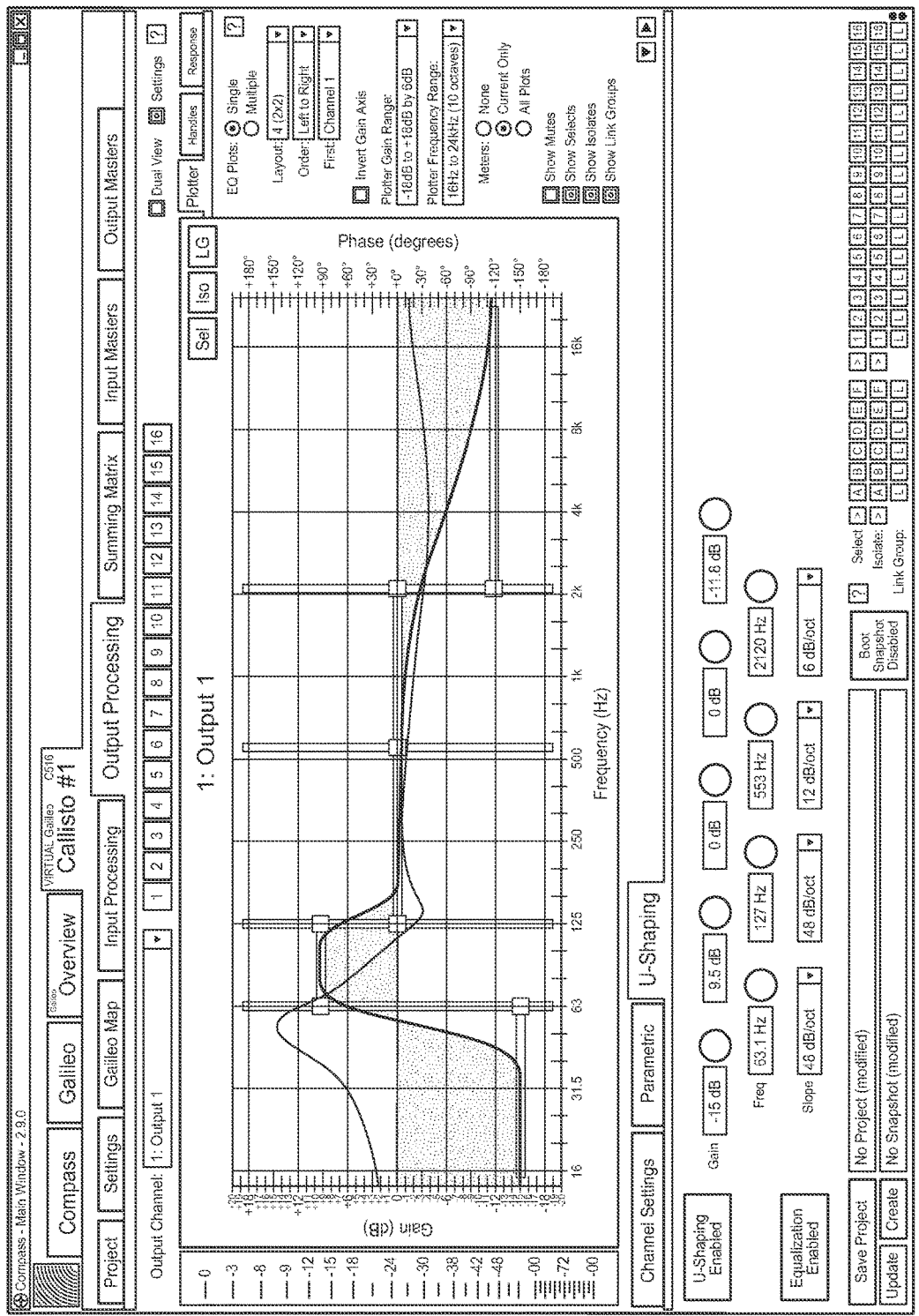
FIG. 11 is an exemplary user interface for an operator of a processor having a multiband filter in accordance with the invention

Selection of the slopes for each break point of the filter gain bands along with gain adjustments within each gain band can be user adjusted through a programmed digital computer having a user interface such as shown in FIG. 11.

While an implementation of the invention has been described in considerable detail in the foregoing specification and accompanying drawings, it is not intended that the invention be hunted to such detail except as necessitated b the following claims.

We claim:

1. A filter for equalizing the frequency response of loudspeaker systems comprising:
at least one band filter section comprised of an n-order high boost or cut shelving filter having a break point frequency, $\omega 1$, and an n-order low boost or cut shelving filter having a break point frequency, $\omega 2$, wherein $\omega 1 < \omega 2$, and wherein the order, n, of at least one of said shelving filters of the band filter section is user selectable for adjusting the slope of the shelving filter at the break point frequency of said shelving filter, and wherein said high and low n-order shelving filters have substantially the same gain and produce a resultant band gain for the band filter section, and
gain correction means for the n-order high shelving filter and n-order low shelving filter for correcting the resultant band gain for the band filter section to a base gain level, said correction means providing a correction factor dependent on the order of the shelving filters.

2. The filter of claim 1 further comprising gain control means for adjusting the corrected-to base gain of the band filter section.

3. The filter of claim 1 wherein the order, n, of both said high and low shelving filters is user selectable for adjusting the slopes of either or both shelving filters at the break point frequencies thereof independent of gain.

4. The filter of claim 1 wherein the filter is a multiband filter comprising of at least two band filter sections, each of said band filter sections being comprised of an n-order high boost or cut shelving filter having a break point frequency, $\omega 1$, and an n-order low boost or cut shelving filter having a break point frequency, $\omega 2$, wherein $\omega 1 < \omega 2$,
wherein the order, n, of at least one of said shelving filters of each band filter section is selectable for adjusting the slope of the shelving filter at the break point frequency of said shelving filter, and
wherein said high and low shelving filters of a band filter section on the multiband filter have substantially the same gain and produce a resultant band gain for the band filter section.

5. The filter of claim 4 further comprising gain control means for independently adjusting gain of any one of said band filter sections.

6. The filter of claim 4, wherein the order, n, of each shelving filter of each band
filter section is user selectable for adjusting the slopes of any one of the shelving filters at the break point frequencies thereof.

7. The filter of claim 1 wherein the selections for said user selectable n-order high and low shelving filters include at least n=1 for a first order filter, n=2 for a second order filter, and n=3 for a third order filter for producing, respectively, user selectable break point slopes of 6 dB/octave, 12 dB/octave, and 18 dB/octave for the band filter section.

8. A filter for equalizing the frequency response of loudspeaker systems comprising:
multiple band filter section, each of said band filter sections being comprised of an n-order high boost or cut shelving filter having a break point frequency, $\omega 1$, and an n-order low boost or cut shelving filter having a break point frequency, $\omega 2$, wherein $\omega 1 < \omega 2$, wherein the order, n, of at least one of said shelving filters of each band filter section is user selectable for adjusting the slope of the shelving filter at the break point frequency of said shelving filter, and wherein said high and low shelving filters have substantially the same gain and produce a resultant band gain for the band filter section,
gain correction means for the n-order high shelving filter and n-order low shelving filter of each band filter section for correcting the resultant band gain for each band filter section to a base gain level, said correction means providing a correction factor dependent on the order of the shelving filters, and
gain control means for adjusting the corrected-to base gain of each band filter section, wherein the gain of each band filter section can be adjusted independently of the slopes of the shelving filters of each band filter section.

9. The filter of claim 8 wherein the order, n, of each shelving filter of each band filter section is user selectable for adjusting the slopes of any one of the shelving filters of any one of the band filter sections at the break point frequencies of the shelving filters.

10. A method creating a multiband filter for equalizing the frequency response of loudspeaker systems having multiple band filter sections, wherein the shape of either end of the band filter section can be adjusted independently of gain, said method comprising:

for each band filter section, constructing of n-order high boost or cut shelving filter having a break point frequency, $\omega 1$, and an n-order low boost or cut shelving filter having a break point frequency, $\omega 2$, wherein $\omega 1 < \omega 2$, wherein the order, n, of at least one of said shelving filters is user selectable for adjusting the slope of the shelving filter at the break point frequency of said shelving filter, wherein the low n-order shelving filter is first constructed and the high n-order shelved filter is derived therefrom, and wherein low n-order shelving filters are constructed for each value of n in accordance with the following steps:

choosing as a basic building block a first order (n=1) frequency-normalized low shelving filter for providing a basic shelving shape and gain level, for each n-order, establishing a s-plane representation of a frequency-normalized n-order Butterworth-type filter, which is represented by n complex poles on a unit circle about the origin of the s-plane, adding n complex zeros to the complex poles on the s-plane representation of the frequency-normalized n-order Butterworth-type filter, wherein each added complex zero has an associated complex pole, and manipulating the added complex zeros on the s-plane to achieve a gain that maintains the basic gain level of the first order filter chosen as the basic building block, wherein the basic gain level is maintained with an altered break-point frequency slope, and wherein the gain of said high and low n-order shelving filters are corrected so that they are substantially the same for any order n, and produce a resultant band gain for the band filter section.

11. The method of claim 10 wherein the complex zeros are moved away from their associated complex pole and the origin of the s-plane on a line that passes through the pole and s-plane origin.

12. The method of claim 10 wherein each complex zero is moved the same distance, wherein the distance is chosen to achieve a desired gain.

13. The method of claim 10 wherein the n-order high shelving filter of each value n is derived from the low n-order shelving filter constructed in accordance with the previous steps by a low to high transformation of the low n-order shelving filter transfer function.

* * * * *